(12) United States Patent
Liu et al.

(10) Patent No.: US 7,911,826 B1
(45) Date of Patent: Mar. 22, 2011

(54) INTEGRATED CIRCUITS WITH CLEARABLE MEMORY ELEMENTS

(75) Inventors: Lin-Shih Liu, Fremont, CA (US); Mark T. Chan, San Jose, CA (US)

(73) Assignee: Altera Corporation, San Jose, CA (US)

( * ) Notice: Subject to any disclaimer, the term of this patent is extended or adjusted under 35 U.S.C. 154(b) by 291 days.

(21) Appl. No.: 12/057,343

(22) Filed: Mar. 27, 2008

(51) Int. Cl.
  *G11C 5/14* (2006.01)
  *G11C 11/41* (2006.01)
  *G11C 11/413* (2006.01)

(52) U.S. Cl. .......... 365/154; 365/226; 365/156; 326/37

(58) Field of Classification Search .................. 365/154, 365/156, 226; 326/37
  See application file for complete search history.

(56) References Cited

U.S. PATENT DOCUMENTS

| | | | |
|---|---|---|---|
| 5,487,037 A | 1/1996 | Lee | |
| 5,581,505 A | 12/1996 | Lee | |
| 5,696,716 A | 12/1997 | Rolandi | |
| 6,128,215 A | 10/2000 | Lee | |
| 6,144,611 A | 11/2000 | Tarbouriech | |
| 6,147,898 A * | 11/2000 | Yamada | 365/156 |
| 6,937,063 B1 | 8/2005 | Sun et al. | |
| 7,023,744 B1 | 4/2006 | Shimanek et al. | |
| 7,200,020 B2 | 4/2007 | Ramaraju et al. | |
| 7,277,351 B2 | 10/2007 | Liu et al. | |
| 2004/0130930 A1 * | 7/2004 | Houston | 365/154 |
| 2007/0109017 A1 | 5/2007 | Liu et al. | |
| 2007/0113106 A1 | 5/2007 | Liu et al. | |
| 2007/0206404 A1 * | 9/2007 | Yamagami | 365/154 |

OTHER PUBLICATIONS

U.S. Appl. No. 11/449,944, filed Jun. 9, 2006 Liu et al.

* cited by examiner

*Primary Examiner* — J. H. Hur
(74) *Attorney, Agent, or Firm* — Treyz Law Group; G. Victor Treyz; Jason Tsai

(57) ABSTRACT

Integrated circuits are provided that have memory elements. The memory elements may be organized in an array. Data such as programmable logic device configuration data may be loaded into the array using read and write control circuitry. Each memory element may store data using a pair of cross-coupled inverters. Power supply circuitry may be used to power the cross-coupled inverters. A positive power supply signal and a ground power supply signal may be provided to the inverters by the power supply circuitry. Each memory element may have an associated clear transistor. A clear control signal may be asserted to turn on the clear transistor when clearing the memory elements. A given one of the inverters in each memory element may be momentarily weakened with respect to the clear transistor in that memory element by using the power supply circuitry to temporarily elevate the ground power supply signal.

5 Claims, 6 Drawing Sheets

INTEGRATED CIRCUITS WITH CLEARABLE MEMORY ELEMENTS

BACKGROUND

This invention relates to integrated circuits, and more particularly, to memory elements in integrated circuits.

Integrated circuits often contain memory elements. Memory elements may be based on cross-coupled inverters and may be used to store data. Each memory element may store a single bit of data.

Memory elements are often arranged in arrays. In a typical array, data lines are used to write data into the memory elements and are used to read data from memory elements that have been loaded with data. Address lines may be used to select which of the memory elements are being accessed. In some arrangements, clear lines are used to clear the memory elements. It may be advantageous to clear a memory array just prior to loading the array with data, as this places each of the memory elements in the array in a known state.

In modern integrated circuit designs, care must be taken to design memory element cells so that they consume relatively small amounts of circuit real estate. At the same time, memory elements must be designed so that operations on the memory elements can be performed reliably. These design requirements sometimes pose challenges for a circuit designer. For example, to ensure that clear operations are performed reliably, it may be desirable to provide a memory element with relatively large clear transistors. Making the clear transistors strong helps to ensure that clear signals can be driven into the memory element cells, regardless of their previous content. At the same time, use of overly-large clear transistors may consume undesirably large amounts of real estate on an integrated circuit.

It would therefore be desirable to provide improved ways in which to clear data from integrated circuit memory elements.

SUMMARY

In accordance with the present invention, integrated circuits are provided that contain memory elements. The memory elements may be formed in an array. Each memory element may contain a pair of cross-coupled inverters that serve as a data storage circuit. During data loading operations, data may be loaded into the elements of the array. During data read operations, loaded data may be read out of the array.

During normal operation following successful data loading, each memory element may provide a corresponding static output signal based on its loaded data value. The static output signals may be applied to circuit elements on the integrated circuit. For example, in a programmable logic device integrated circuit, static output signals from the memory elements may be applied to the gates of programmable metal-oxide-semiconductor transistors.

Prior to data loading operations, the memory elements may be cleared. Each memory element may have an associated clear transistor. One source-drain terminal of the clear transistor may be connected to a positive power supply terminal. The other source-drain terminal of the clear transistor may be connected to an output of a given one of the cross-coupled inverters in the memory element. The clear transistor may have a gate that receives a clear control signal. Control circuitry may assert the clear control signal when it is desired to turn on the clear transistor to clear the memory element. The clear control signal may be deasserted following successful clear operations.

The given one of the cross-coupled inverters in each memory element may be powered by a positive power supply signal and a ground power supply signal. Power supply circuitry on the integrated circuit may supply the positive power supply signal and the ground power supply signal to the given inverter in each memory element.

To ensure that the clear transistor can satisfactorily overpower the given inverter in each memory element during clear operations, the power supply circuitry may be used to temporarily weaken the given inverter in the pair of cross-coupled inverters by momentarily elevating the ground power supply signal. After data has been cleared from the memory array, the elevated ground power supply signal may be returned to its normal voltage level (e.g., 0 volts). The clear control signal may then be deasserted to complete data clearing operations.

Once the data array has been cleared, data such as programmable logic device integrated circuit configuration data or other suitable data may be loaded into the cleared memory elements.

Further features of the invention, its nature and various advantages will be more apparent from the accompanying drawings and the following detailed description of the preferred embodiments.

DETAILED DESCRIPTION

Figure 1:
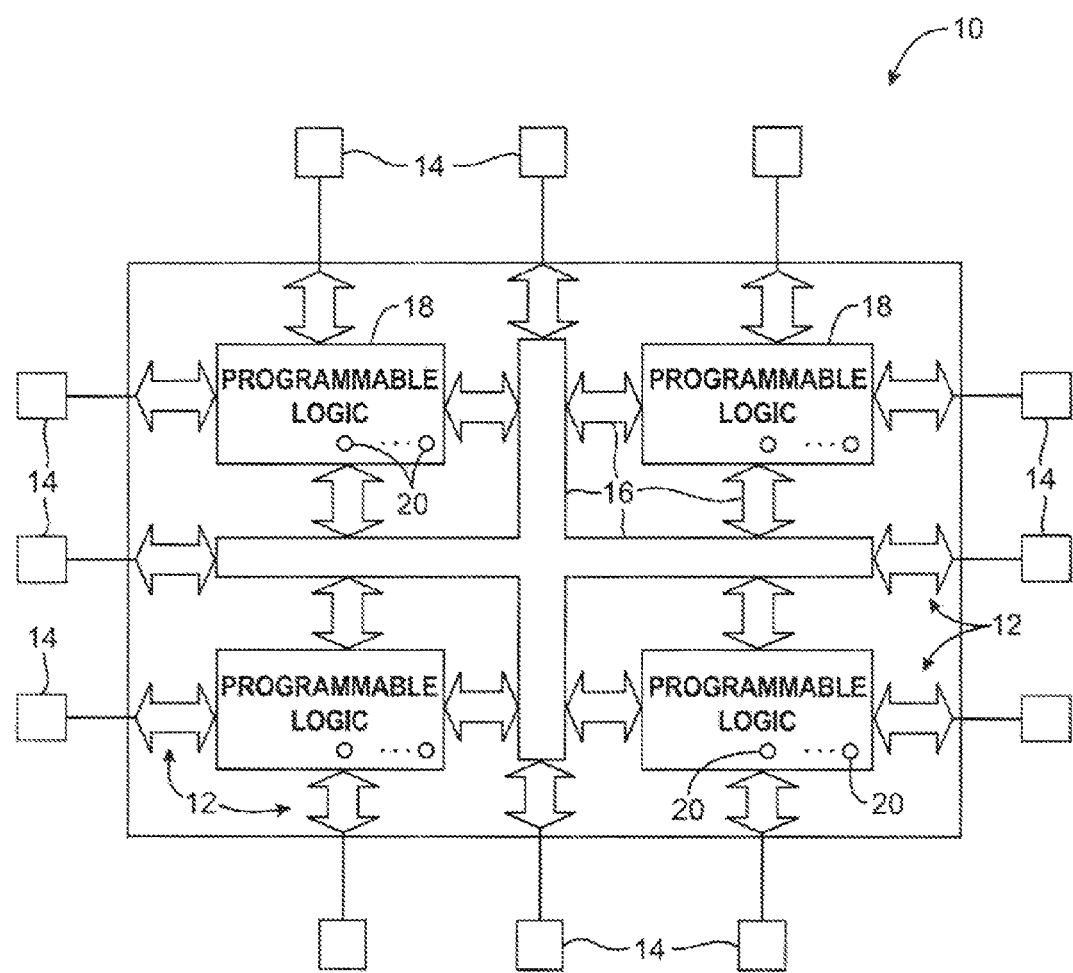
FIG. 1 is a diagram of an illustrative integrated circuit that may contain memory elements such as a programmable logic device integrated circuit in accordance with an embodiment of the present invention.

The present invention relates to integrated circuits containing memory elements. The integrated circuits may be memory chips, digital signal processing circuits with memory arrays, microprocessors, application specific integrated circuits with memory arrays, programmable logic device integrated circuits in which memory elements are used for configuration memory, or any other suitable integrated circuit.

The memory elements may be volatile memory elements. Loaded data may be maintained within volatile memory elements so long as the volatile memory elements are powered. Data is generally lost when power is removed.

The memory elements may be used in any suitable integrated circuit. With one illustrative arrangement, the memory elements are used to store control data for programmable logic on a programmable integrated circuit. In this type of arrangement, the volatile memory elements may be formed on an array on a programmable integrated circuit. During operation, each memory element in the array may produce a respective control signal that is used in controlling the operation of an associated programmable circuit element such as an n-channel or p-channel metal-oxide-semiconductor transistor. The programmable integrated circuit may be a programmable logic device integrated circuit in which the loaded memory element data is used in programming associated programmable logic. Data of this type is generally referred to as programming data or configuration data.

Programmable logic devices can be customized in relatively small batches to implement a desired logic design. In a typical scenario, a programmable logic device manufacturer designs and manufactures uncustomized programmable logic device integrated circuits in advance. Later, a logic designer uses a logic design system to design a custom logic circuit. The logic design system uses information on the hardware capabilities of the manufacturer's programmable logic devices to help the designer implement the logic circuit from the resources available on a given programmable logic device.

The logic design system creates configuration data based on the logic designer's custom design. When the configuration data is loaded into the memory elements of one of the programmable logic devices, it programs the logic of that programmable logic device so that the programmable logic device implements the designer's logic circuit. The use of programmable logic devices can drastically reduce the amount of effort required to implement a desired integrated circuit design.

Memory elements such as the memory elements that may be used to store configuration data on programmable logic device integrated circuits may be powered using a positive power supply voltage and a ground. The positive power supply voltage may be referred to as Vcccell and may be the same power supply voltage that is used to power the main "core" logic on a programmable logic device integrated circuit or other integrated circuit. The ground voltage may be referred to as Vgndcell and may be the same ground power supply voltage that is using in powering the core logic.

Integrated circuits that operate at low power supply voltages may offer benefits over integrated circuits that operate at higher power supply voltages. For example, reductions in the power supply voltage that is used in powering the core logic on an integrated circuit generally lead to reduced power consumption. Because of these benefits, the semiconductor industry is continually striving to produce processes and circuit designs that support reductions in power supply voltages. Examples of suitable positive power supply voltages that may be used in powering memory elements and core logic are 1.5 volts, 1.2 volts, 1.0 volts, and 0.9 volts. Other positive power supply voltages may also be used. For example, a positive power supply voltage Vcccell of greater than 1.0 volts or less than 1.0 volts may be used in powering memory elements and core logic on an integrated circuit. Ground voltage Vgndcell may be 0 volts or any other suitable voltage and may be used in powering memory elements and core logic.

Circuit area ("real estate") is generally at a premium in modern integrated circuit designs. Circuits with small components can experience enhanced manufacturing yields, lower costs, and improved performance. In contrast, designs that use circuit real estate inefficiently may be costly to produce and may not perform as well as more compact arrangements.

As a result of these considerations, is desirable to minimize the amount of area consumed by the transistors in the memory elements on an integrated circuit. Memory elements typically include cross-coupled inverters that serve as bistable data storage elements. Address transistors may be used in addressing groups of memory elements during read and write operations. For example, all of the memory elements in a given column of a memory array may share a common address line. Address transistors may be coupled between the address line and respective cross-coupled inverters in the memory elements. When the address line is asserted, the address transistors may be turned on, coupling the address transistors to respective data lines.

Clear transistors may be used to selectively clear the memory elements during power up or reconfiguration operations. With one suitable arrangement, each memory element has a clear transistor that is coupled to an associated clear path. Each clear transistor may have a gate terminal that is connected to the clear path and source-drain terminals connected respectively to a positive power supply terminal and an output associated with one of the cross-coupled inverters in the memory element. The clear path may be used to provide a clear signal to the clear transistors. When the clear signal is asserted, the clear transistors may be turned on to clear the contents of the memory elements.

To minimize the amount of circuit real estate associated with the memory elements, care should be taken not to make the sizes of the clear transistors too large. If the clear transistors are too large, the memory elements and therefore the memory element array on the integrated circuit may consume undesirably large amounts of circuit real estate. At the same time, proper operation of the memory element array requires that the clear transistors be sized appropriately relative to the cross-coupled inverters. If the clear transistors are too small and therefore too weak relative to the cross-coupled inverters, it will not be possible to reliably drive signals into the memory array during clearing operations.

In accordance with an embodiment of the present invention, control circuitry is provided on an integrated circuit that momentarily raises the ground voltage Vgndcell during clear operations. This elevation of the memory element ground signal temporarily weakens the cross-coupled inverters in the memory elements. The clear transistors may be asserted while the memory element inverters are in this weakened state. Because the memory element inverters are weakened, the clear transistors need not be made as large as would otherwise be required to ensure reliable operation. This makes it possible to minimize the size of the memory elements.

An integrated circuit 10 in which memory element ground voltages may be adjusted in this way is shown in FIG. 1. Integrated circuit 10 may be any suitable integrated circuit, such as a programmable logic device integrated circuit (as an example).

As shown in FIG. 1, programmable logic device integrated circuit 10 may have input/output circuitry 12 for driving signals off of device 10 and for receiving signals from other integrated circuits via input/output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18.

Programmable logic device 10 contains memory elements 20 that can be loaded with data such as configuration data (also called programming data) using pins 14 and input/output circuitry 12. Once loaded, the memory elements may each provide a corresponding static control output signal that controls the state of an associated logic component in programmable logic 18. The memory element output signals are typically applied to the gates of metal-oxide-semiconductor (MOS) transistors. These transistors may include n-channel metal-oxide-semiconductor (NMOS) pass transistors in programmable components such as multiplexers. Some of the output signals may be used to control p-channel metal-oxide-semiconductor (PMOS) transistors such as power-down transistors.

When a memory element supplies a high output to a NMOS pass transistor, the transistor is turned on and passes logic signals from its input to its output. When the memory element output is low, the pass transistor is turned off and does not pass logic signals. Being able to configure pass transistors in this way allows the programmable logic of the programmable logic device to be programmed to implement a desired logic design.

When a memory element supplies a low output to a PMOS power-down transistor, the transistor is turned on. This allows a block of associated logic circuitry to receive power. When the memory element supplies a high output to the PMOS power-down transistor, the transistor is turned off. This powers down the block of circuitry.

A typical memory element 20 is formed from a number of transistors configured to form cross-coupled inverters. With one suitable approach, complementary metal-oxide-semiconductor (CMOS) integrated circuit technology is used to form the memory elements 20, so CMOS-based memory element implementations are described herein as an example. In the context of programmable logic device integrated circuits, the memory elements store configuration data and are therefore sometimes referred to as configuration random-access memory (CRAM) cells.

The memory elements may be loaded from an external source such as a configuration device integrated circuit via pins 14 and input/output circuitry 12. The loaded memory elements 20 provide static control signals that are applied to the terminals of circuit elements in programmable logic 18 to turn certain circuit elements on or off and thereby configure the logic in programmable logic 18. The circuit elements may parts of multiplexers, look-up tables, logic arrays, AND, OR, NAND, and NOR logic gates, etc. There may be any suitable number of memory elements 20 on device 10. For example, there may be thousands or millions of memory elements 20 on device 10.

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

Figure 2:
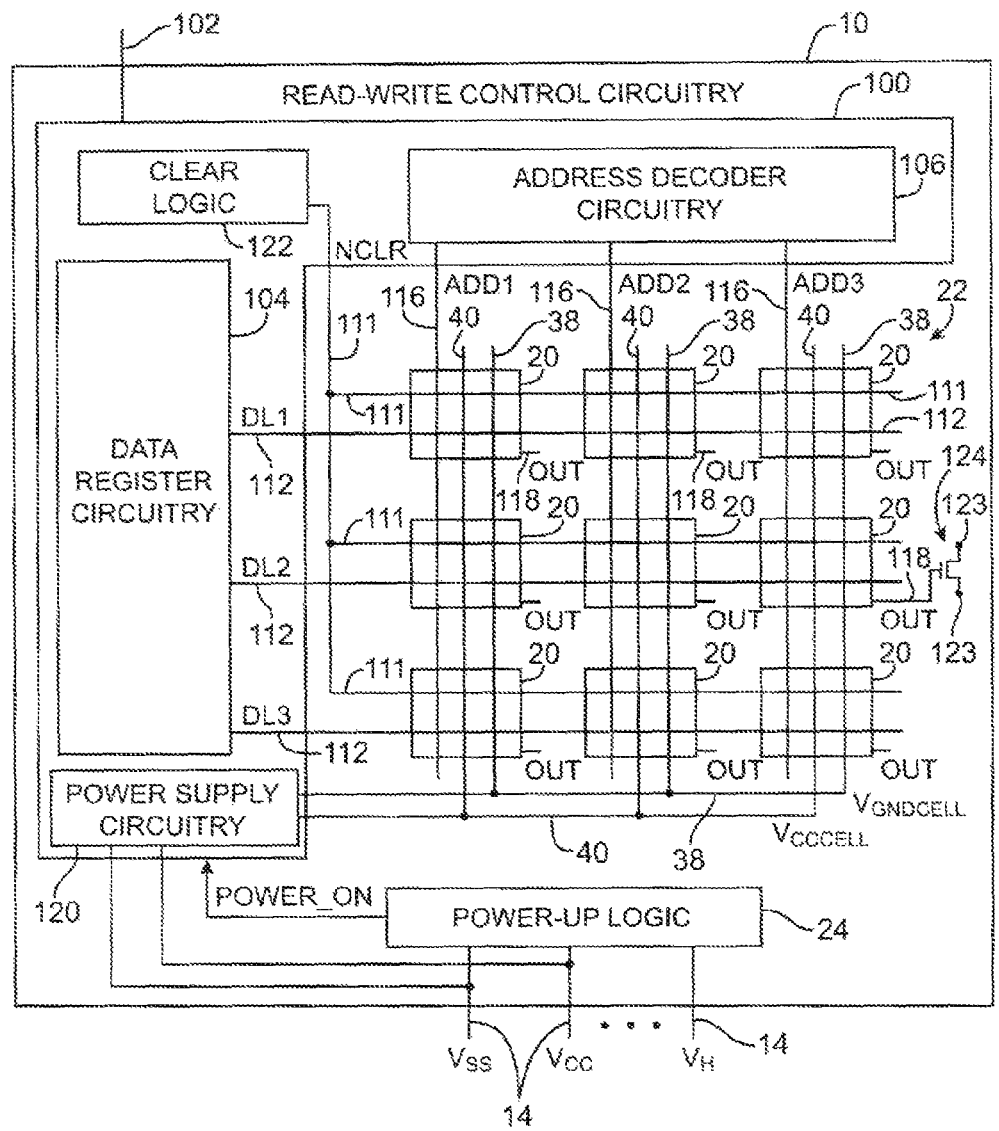
FIG. 2 is a diagram of an illustrative integrated circuit such as a programmable logic device integrated circuit that has an array of memory elements and associated read and write control circuitry in accordance with an embodiment of the present invention.

When memory elements are arranged in an array, horizontal and vertical conductors and associated loading circuitry may be used to load the memory elements with configuration data. A data loading arrangement is shown in FIG. 2. The arrangement of FIG. 2 has a 3×3 array 22 of memory elements 20. (Actual memory arrays typically have hundreds or thousands of rows and columns, but a 3×3 array is used as an example.) The array 22 receives power via positive power supply line 40 and ground line 38.

As shown in FIG. 2, device 10 may receive power supply signals such as positive power supply signal Vcc and ground power supply signal Vss from external sources using input-output pins 14. Positive power supply signal Vcc may have any suitable voltage (e.g., 1.0 volts, a voltage greater than 1.0 volts, or a voltage less than 0 volts). Ground power supply signal Vss may have a voltage of 0 volts or other suitable ground signal voltage. If desired, additional power supply voltages may be supplied to device 10. For example, one or more elevated power supply voltages Vh may be provided to device 10. Power supply voltages such as voltages Vcc, Vss, and Vh may also be generated internally based on externally-received voltages. As an example, on-chip voltage divider circuitry, charge pump circuitry, or other power regulator circuitry may be used in generating suitable power supply voltages. Voltages such as voltage Vh may be larger than Vcc and may be applied to portions of device 10 when an elevated power supply voltage is desired.

Device 10 may have power-up logic 24. Power-up logic 24 may receive power supply signals such as Vcc, Vss, and Vh and may process these signals to determine when the power supply levels on device 10 have reached their desired levels. When power-up logic 24 has determined that the power supply signals on device 10 are valid, a suitable control signal may be asserted (e.g., signal POWER_ON in the example of FIG. 2). This control signal may be used to activate circuitry on device 10 (e.g., circuitry that would not function properly before power-up operations are complete).

Memory array read and write control circuitry 100 may be used to control operations such as data loading, data read operations, and clear operations. Read-write control circuitry 100 may include power supply circuitry 120. Power supply circuitry 120 may receive power supply voltages such as power supply voltages Vss and Vcc and control signals such as control signal POWER_ON and may produce corresponding memory array and core logic power supply signals. With one suitable arrangement, a power supply voltage equal to Vss and a power supply voltage equal to Vcc may be used as a core logic power supply voltages for core logic on device 10 (e.g., core programmable logic 18).

Power supply circuitry 120 may also produce memory array power supply signals Vcccell and Vgndcell. Positive power supply signal Vcccell may be routed to memory elements 20 in array 22 using power supply path 40. Ground power supply signal Vgndcell may be routed to memory elements 20 in array 22 using power supply path 38.

Power supply signals Vcccell and Vgndcell may have voltages that vary as a function of time (e.g., depending on the nature of the operations being performed by read-write control circuitry 100, etc.). Any suitable control circuitry may be used to control power supply circuitry 120. For example, programmable logic on device 10, hardwired logic on device 10, or external control circuitry may supply control signals for power-supply circuitry 120. Power-supply circuitry 120 may also be responsive to the signal POWER_ON from power-up logic 24. Signals that may be supplied to read-write control circuitry 100 over path 102 may include control signals for controlling clear operations, control signals for addressing certain sets of memory elements 20, and data signals for loading into memory elements signal.

A clear signal path 111 (labeled NCLR) may be used to route the clear control signal NCLR to memory elements 20 from clear logic 122. The signal NCLR may be asserted by clear logic 122 (e.g., by taking NCLR low to turn on associated p-channel clear transistors in elements 20) when it is desired to clear the contents of the memory array 22. Array 22 may be cleared on power-up or later, as part of a memory array reconfiguration operation. After array 22 has been cleared, configuration data may be loaded from data register circuitry 104. Clear logic 122 may, if desired, be responsive to control signals received from path 102.

Configuration data or other suitable data may be provided in series to data register circuitry 104 via path 102 (e.g., from an external source). This data may then be provided in parallel to array 22 via data lines 112. In the example of FIG. 2, three data signals DL1, DL2, and DL3 are shown, because there are three corresponding rows of memory elements 20. This is merely illustrative. There may be any suitable number of rows of memory elements 20 in array 22 and any suitable number of data lines 112.

Address decoder circuitry 106 may receive addressing information via input 102. In response, address decoder circuitry 106 may assert a desired one of the address lines 116 (e.g., by taking an appropriate one of signals ADD1, ADD2, or ADD3 to a logic high value). When an address line is asserted in a given column during data loading operations, the data on the data lines 112 may be loaded into the memory elements 20 in that column. The array may be filled by systematically loading the memory elements in each of the columns of the array. After the array has been completely loaded with configuration data, the output 118 of each memory element 20 may produce a corresponding static output control signal for controlling the gate of a transistor in programmable logic 18 (FIG. 1) such as illustrative transistor 124. During data read operations (e.g., to confirm successful loading of elements 20), address lines 116 may be systematically asserted while data is conveyed from memory elements 20 to data register circuitry 104 via data lines 112.

Figure 3:
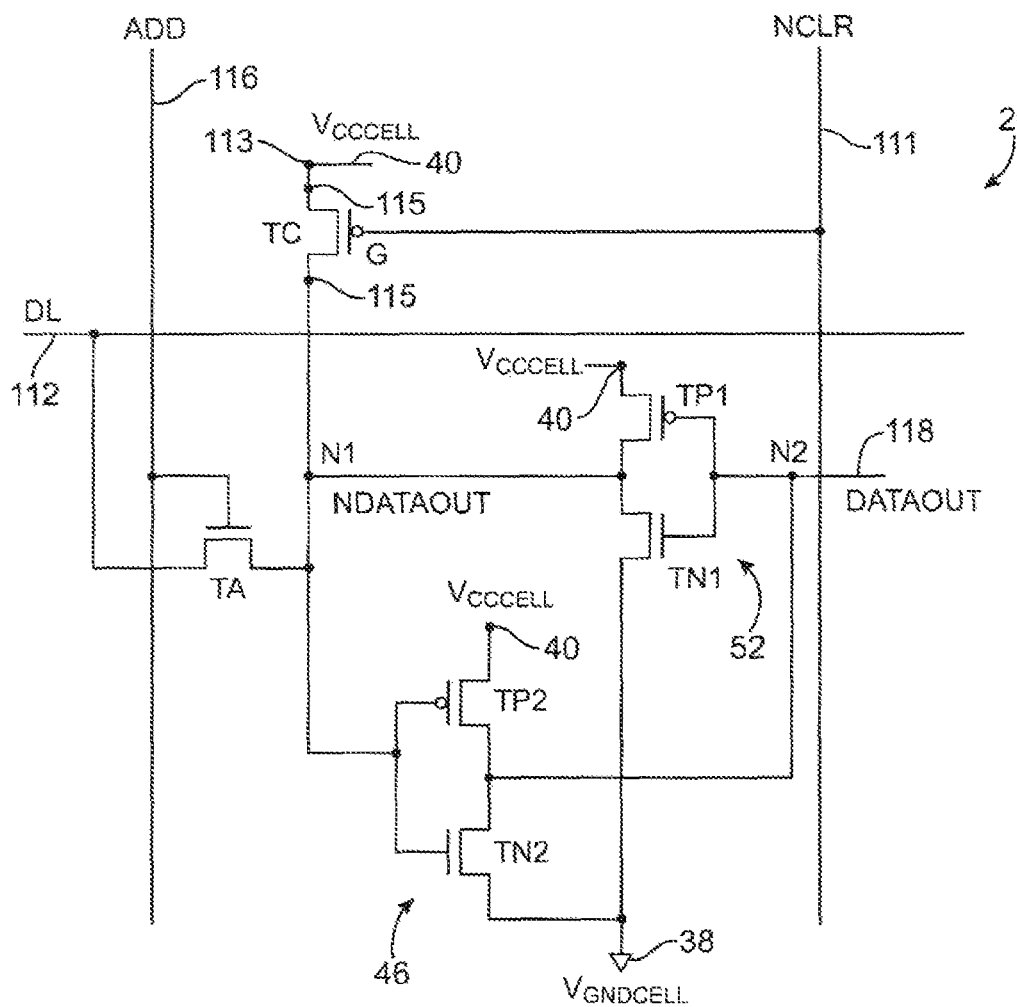
FIG. 3 is a diagram of an illustrative memory element for use in an array of memory elements of the type shown in FIG. 2 in accordance with an embodiment of the present invention.

A memory element 20 of the type that may be used in array 22 of FIG. 2 is shown in FIG. 3. As shown in FIG. 3, memory element 20 may be formed from two cross-coupled inverters—inverter 46 and inverter 52. Inverter 46 has a p-channel metal-oxide-semiconductor (PMOS) transistor TP2 and an n-channel metal-oxide-semiconductor (NMOS) transistor TN2. Inverter 52 has PMOS transistor TP1 and NMOS transistor TN1.

Inverters 46 and 52 form a bistable memory element. In one stable state (which is generally referred to as the "cleared" state of memory element 20), signal NDATAOUT at the output of inverter 52 (node N1) is high (e.g., at Vcccell) and represents a logic one, whereas signal DATAOUT at the output of inverter 46 (node N2) is low (e.g., at Vgndcell) and represents a logic zero. In the other stable state (which is generally referred to as the "programmed" state of memory element 20), signal NDATAOUT is low and signal DATAOUT is high. During normal operation of device 10, the output of memory element 20 on line 118 (i.e., signal DATAOUT) is applied to the gates of programmable transistors (e.g., transistor 124 of FIG. 2).

Clear transistor TC is used in clearing memory element 20. In the example of FIG. 3, transistor TC is a p-channel metal-oxide-semiconductor transistor. As a result, transistor TC may be turned on by taking clear control signal NCLR on gate G of transistor TC to a logic low level (i.e., by asserting signal NCLR to take NCLR to ground). Transistor TC may be turned off by taking signal NCLR high. When signal NCLR is deasserted (i.e., when NCLR is high), transistor TC is off and the output of inverter 52 is not electrically connected to power supply voltage Vcccell at terminal 113. When signal NCLR is asserted, transistor TC is on so that each of its source-drain terminals 115 is connected to the other. In this situation, terminal 113 is connected to the output of inverter 52, pulling signal NDATAOUT and node N1 high to positive power supply voltage Vcccell.

During data writing operations, address line 116 is asserted to address memory element 20. (Other memory elements 20 in the same column are generally addressed in this way at the same time.) When address line 116 is taken high, address transistor TA is turned on and the data signal DL on data line 112 is driven into the memory element 20 on node N1. Clear operations are preferably performed before data writing operations. Following clear operations, node N1 will be high. If the data signal DL on line 112 during data writing is high, node N1 will remain high. The output DATAOUT in this situation will be low. If the data signal DL on data line 112 is low, node N1 will be taken low during the write operation, because transistor TA is configured to be strong enough to overpower inverter 52. Due to the inversion of the low N1 signal by inverter 46, the voltage on node N2 will taken high. This will make the output DATAOUT high.

During data read operations, a desired address line 116 is asserted while the resulting signals on the data lines 112 are monitored by read and write control circuitry 100. If desired, each data line 112 may be precharged using a weak pull-up PMOS transistor or other suitable circuitry prior to data read operations. If the signal on a given node N1 is high (i.e., if DATAOUT is low), data signal DL on the associated data line 112 will be high during read operations. If the signal on a given node N1 is low (i.e., if DATAOUT is high), inverter 52 will pull data signal DL on data line 112 low during the read operation.

After the array of memory elements 20 has been successfully loaded and any desired data read operations have been performed to ensure that the data has been loaded properly, memory elements 20 may be used to support normal operation of device 10. For example, in the context of a programmable logic device integrated circuit, each memory element 20 may supply a corresponding output control signal on its path 118. The DATAOUT signal on each memory element's path 118 may be applied to the gate of a corresponding programmable transistor. For example, the DATAOUT signal may be applied to the gate of an NMOS pass transistor in programmable logic 18. In this type of arrangement, the pass transistor will be off when DATAOUT is low. When DATAOUT is high, the pass transistor will be on and will allow data to flow between its source-drain terminals (e.g., source-drain terminals 123 of FIG. 2). If desired, memory elements 20 may be used to store control signals for PMOS transistors (e.g., on a programmable logic device integrated circuit or other suitable integrated circuit). PMOS transistors may be used as power-down transistors to selectively turn off unused portions of circuitry when it is desired to conserve power (as an example).

When clearing memory element 20, clear transistor TC must drive a logic one onto node N1. Once node N1 and signal NDATAOUT have been pulled high to Vcccell by transistor TC, the inversion operation performed by inverter 46 will pull node N2 and signal DATAOUT on path 118 low. The success of this clearing operation requires that clear transistor TC be able to overpower inverter 52 and, in particular, that TC be strong enough to overpower NMOS transistor TN1 in inverter 52. One way in which to ensure that transistor TC is stronger than transistor TN1 is to make transistor TC significantly larger than transistor TN1. This type of approach may be satisfactory in some circumstances, but has the disadvantage of requiring a relatively large transistor size for transistor TC. When transistor TC is large, memory element 20 may consume more real estate than desired.

In accordance with an embodiment of the present invention, control circuitry 100 (FIG. 2) may adjust the power supply signals applied to inverter 52 during clear operations. This temporarily weakens the strength of inverter 52 and makes it easier for clear transistor TC to overpower inverter 52 during clear operations.

Any suitable power supply modulation technique may be used to momentarily weaken inverter 52. With one illustrative arrangement, ground power supply signal Vgndcell is temporarily elevated with respect to its nominal level. For example, if the voltage of Vgndcell is 0 volts during normal operation, ground power supply signal Vgndcell may be temporarily raised above 0 volts. When Vgndcell is raised in this way, the gate-source voltage Vgs of transistor TN1 in inverter 52 is lowered, thereby temporarily weakening transistor TN1 and inverter 52. Clear transistor TC can be activated by asserting clear signal NCLR while transistor TN1 and inverter 52 are in their temporarily weakened state. Because transistor TN1 and inverter 52 are weakened, it is relatively easy for clear transistor TC to pull node N1 and signal NDATAOUT high. This is true even when memory element 20 is in a programmed state in which signal DATAOUT is high and is attempting to turn on transistor TN1 to pull node N1 to Vgndcell.

Figure 4:
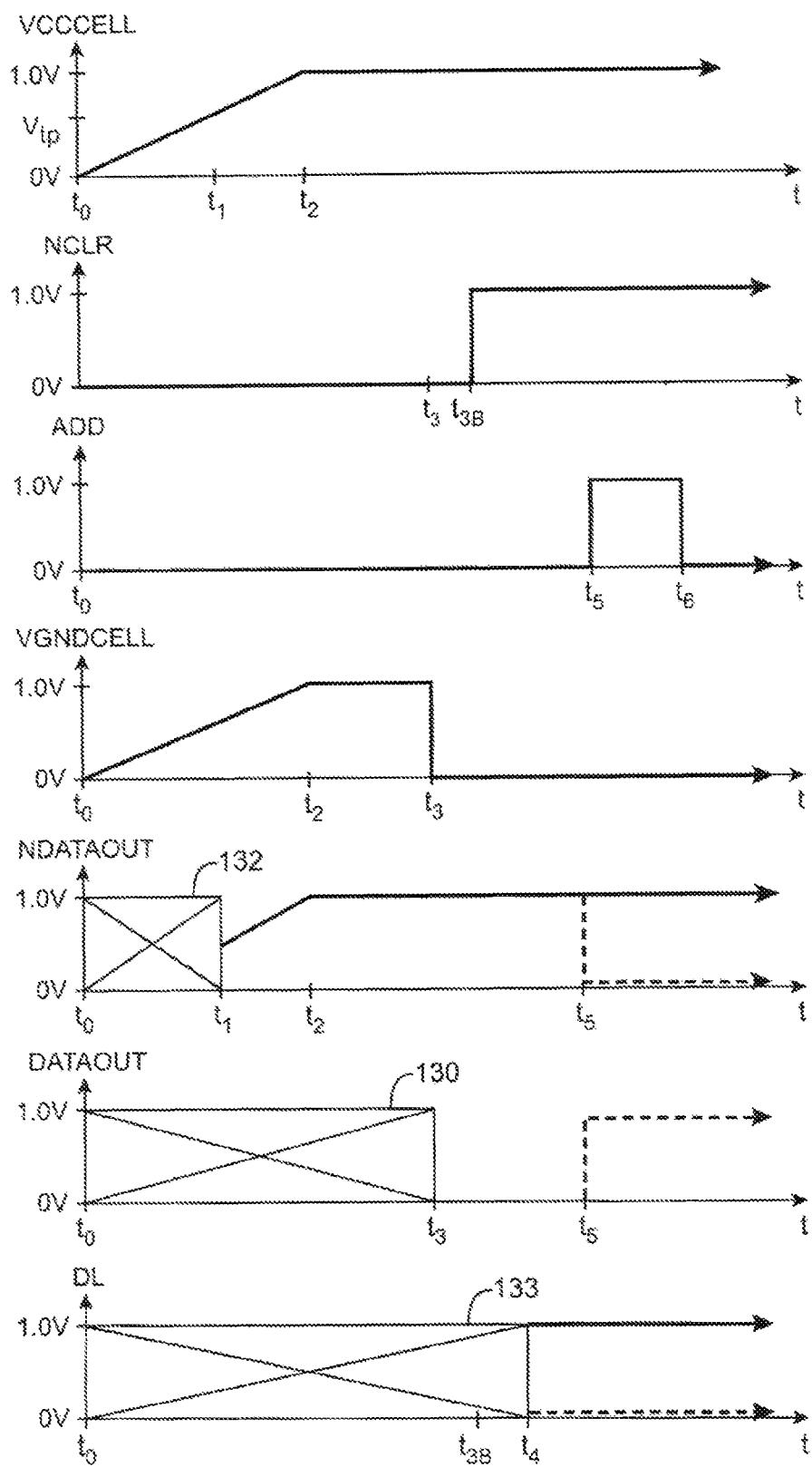
FIG. 4 shows graphs of illustrative signal voltages involved when clearing memory elements and loading data into memory elements of the type shown in FIG. 3 using circuitry of the type shown in FIG. 2 during power-up operations in accordance with an embodiment of the present invention.

FIG. 4 shows graphs of illustrative signals that may be involved in clearing memory element 20 using this type of arrangement. In the example of FIG. 4, memory element 20 is being cleared as part of a power-up operation. Power-up operations arise when integrated circuit 10 is being powered up on a system board (i.e., as power supply signals Vss, Vcc, and, if desired, other power supply signals such as Vh are first being applied to integrated circuit 10).

When integrated circuit 10 is unpowered, signals Vcccell, NCLR, ADD, Vgndcell, NDATAOUT, DATAOUT, and DL are at 0 volts. As shown in the first (uppermost) trace of FIG. 4, positive power supply signal Vcccell may therefore initially be at ground (0 volts). At time t0, power supply circuitry 120 may begin to raise power supply signal Vcccell on path 40 to power memory elements 20. During initial power-up operations, the state of the NDATAOUT signal and the DATAOUT signal are not known, as indicated by box 132 in the fifth trace of FIG. 4 and box 130 in the sixth trace of FIG. 4. Because the initial state of signal NDATOUT on power up is not known, it is possible that the NDATAOUT signal will power up as a logic zero. In this situation, clear transistor TC will need to pull the low voltage of signal NDATAOUT on node N1 to a high value. This may be accomplished only if transistor TC is able to overpower transistor TN1 in inverter 52.

If NDATAOUT powers up as a logic low, signal DATAOUT on node N2 will power up as a logic high and will attempt to turn on transistor TN1. To ensure that transistor TC can overpower transistor TN1 in these circumstances, power-supply circuitry 120 may raise the value of Vgndcell above 0 volts, as shown in the fourth trace of FIG. 4. This weakens transistor TN1. Even if the power-up process produces a DATAOUT signal that starts to take the gate of transistor TN1 high (and therefore tends to turn on transistor TN1), the elevated Vgndcell value supplied to ground terminal 38 will ensure that the gate-source voltage Vgs of transistor TN1 remains less than the threshold voltage Vt of transistor TN1. Because the gate-source voltage Vgs of transistor TN1 will remain less than the threshold voltage for transistor TN1, transistor TN1 will remain off. This allows a relatively small clear transistor TC to overpower TN1 and pull signal NDATAOUT high as needed to clear memory element 20.

As shown in FIG. 4, the power-up process may start at time t0. In the FIG. 4 scenario, power supply circuitry 120 has raised power supply voltage Vcccell above threshold voltage Vtp of transistor TC by time t1, as shown in the first trace of FIG. 4. Clear signal NCLR is asserted by maintaining NCLR at 0 volts for times less than t3b, as shown in the second trace of FIG. 4. Accordingly, at time t1 transistor TC turns on and signal NDATAOUT becomes equal to Vcccell, as shown in the fifth trace of FIG. 4.

Between times t1 and t2, power supply circuitry 120 continues to raise Vcccell and Vccgndcell, as shown in the first and fourth traces of FIG. 4. Signal NDATAOUT tracks signal Vcccell, because transistor TC is on. At time t2, the ramp up of power supply signal Vcccell is complete and power supply circuitry 120 stops raising Vgndcell. The maximum value to which Vcccell and Vgndcell are raised may be (for example) 1.0 volts (i.e., the nominal Vcc value for integrated circuit 10).

At time t3, power-up logic 24 determines that the power-up process is complete and informs power supply circuitry 120 accordingly (e.g., using control signal POWER_ON). In response, power supply circuitry 120 takes ground power supply signal Vgndcell low (i.e., to its nominal 0 volt level). As power supply signal Vgndcell falls, transistor TN2 in inverter 46 turns on, because signal NDATAOUT on node N1 at the gate of transistor TN2 is high. Transistor TP2 in inverter 46 is off, because NDATAOUT is high. With transistor TN2 on and transistor TP2 off, signal DATAOUT at the output node N2 of inverter 46 is pulled low (i.e., to 0 volts), as indicated in the sixth trace of FIG. 4. At times greater than time t3, with DATAOUT equal to 0 volts, transistor TN1 will remain off, indicating that transistor TC was able to successfully drive a low value of DATAOUT onto node N2 and a high value of NDATAOUT onto node N1, thereby clearing memory element 20. At time t3B, clear signal NCLR is deasserted (taken high), indicating that clearing operations are complete.

Following the successful clearing of memory element 20 during power-up operations, data may be loaded into memory element 20. In preparation for data loading operations, configuration data or other suitable data may be loaded into data register circuitry 104 (e.g., using path 102 of FIG. 2). Data register circuitry 104 and address decoder circuitry 106 of control circuitry 100 may then be used to load this data into the memory elements of memory array 22.

Either a logic one or a logic zero may be loaded into each memory element. The loading of a logic zero onto node N2 is represented by solid lines at times after time t4 in the fifth, sixth, and seventh traces of FIG. 4. The loading of a logic one onto node N2 is represented by dashed lines at times after time t4 in the fifth, sixth, and seventh traces of FIG. 4.

To load a logic zero, data register circuitry 104 takes data signal DL high at time t4, as indicated by the solid line in the seventh trace of FIG. 4. (The value of DL prior to T4 does not affect data loading operations as indicated by box 133.) With data signal DL high on data line 112, address signal ADD is asserted. As shown in the third trace of FIG. 4, address signal ADD may be asserted by taking signal ADD high at time t5.

When address signal ADD is taken high in this way, address transistor TA is turned on. This electrically connects line 112 to node N1. With transistor TA on and data signal DL at a high level on line 112, the high NDATAOUT value on node N1 and the low DATAOUT value on node N2 remain unchanged between times t5 and t6, as shown by the solid lines in the fifth and sixth traces of FIG. 4. At time t6, address signal ADD is deasserted to complete the data loading process, as shown in the third trace of FIG. 4.

To load a logic one, data register circuitry 104 takes data signal DL low at time t4, as indicated by the dashed line in the seventh trace of FIG. 4. While data signal DL is low on data line 112, address signal ADD is asserted (times t5 to t6 in the third trace of FIG. 4). When transistor TA is turned on by the high ADD signal, data line 112 is electrically connected to node N1. Signal DL on data line 112 is low at time t5, so when TA is turned on at t5, signal NDATAOUT on node N1 is pulled low, as shown by the dashed line in the fifth trace of FIG. 4. When NDATAOUT goes low, the output of inverter 46 at node N2 goes high, so signal DATAOUT goes high at time t5, as indicated by the dashed line in the sixth trace of FIG. 4. At time t6, address signal ADD is deasserted to complete the data loading process, as shown in the third trace of FIG. 4.

If desired, a fresh set of data can be loaded into a previously loaded memory array. This process, which is sometimes referred to as "reconfiguration," is illustrated by the graphs of FIG. 5.

Before new data is loaded into memory array 22, memory array 22 may be cleared. As shown in FIG. 5, at times before t1, the state of signals NDATAOUT and DATAOUT for a given memory element are unknown, because they depend on the value of the previously loaded data bit in that memory element. At time t1, power supply circuitry 120 takes ground power supply signal Vgndcell to an elevated level (e.g., 1.0 volts) to turn off transistor TN1 and thereby weaken inverter 52 in preparation for clearing operations, as shown in the fourth trace of FIG. 5. Signal NDATA floats at times t1 to t2, because transistor TN1 is off. After transistor TN1 has been turned off, clear signal NCLR may be asserted to clear memory element 20. As shown in the second trace of FIG. 5, signal NCLR may be asserted (taken low) between times t2 and t4. When signal NCLR goes low at time t2, clear transistor TC is turned on and signal NDATAOUT is pulled high, as shown in the fifth trace of FIG. 5.

Figure 5:
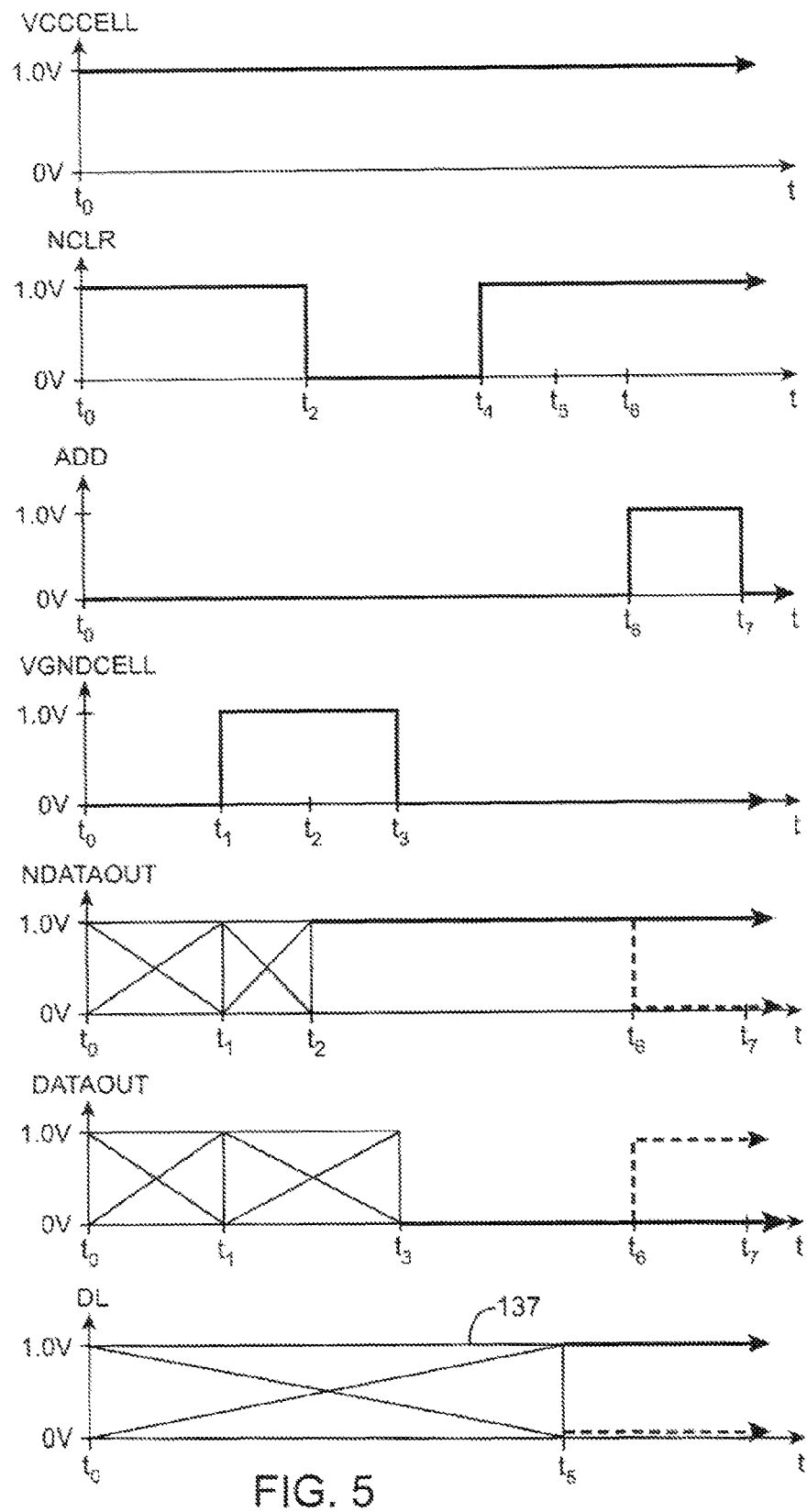
FIG. 5 shows graphs of illustrative signal voltages involved during reconfiguration operations when clearing loaded memory elements and loading data into cleared memory elements of the type shown in FIG. 3 using circuitry of the type shown in FIG. 2 in accordance with an embodiment of the present invention.

At time t3, power supply circuitry 120 may take ground power supply signal Vgndcell low, as shown in the fourth trace of FIG. 5. Between times t1 and t3, the signal DATAOUT is floating, because transistor TN2 is off. At time t3, signal DATAOUT becomes valid, because transistors TN1 and TN2 are enabled by the low Vgndcell voltage on path 38. At time t4, after ground power supply signal Vgndcell has settled, clear signal NCLR may be deasserted, as shown in the second trace of FIG. 5. This completes the clearing process.

The value of data signal DL on data line 112 at times prior to time t5 does not affect the data loading process, as indicated by box 137 in the seventh trace of FIG. 5. At times t5 to t6, data may be loaded into data register circuitry 104 via path 102 (FIG. 2). At times t6 to t7, address signal ADD may be asserted to load data into the memory cell.

Either a logic one or a logic zero may be loaded into each memory element. The loading of a logic zero onto node N2 is represented by solid lines at times after time t5 in the fifth, sixth, and seventh traces of FIG. 5. The loading of a logic one onto node N2 is represented by dashed lines at times after time t5 in the fifth, sixth, and seventh traces of FIG. 5.

To load a logic zero, data register circuitry 104 takes data signal DL high at time t5, as indicated by the solid line in the seventh trace of FIG. 5. With data signal DL high on data line 112, address signal ADD is asserted. As shown in the third trace of FIG. 5, address signal ADD may be asserted by taking signal ADD high at time t6. When address signal ADD is taken high, address transistor TA is turned on. This electrically connects line 112 to node N1. With transistor TA on and data signal DL at a high level on line 112, the high NDATAOUT value on node N1 and the low DATAOUT value on node N2 remain unchanged between times t6 and t7, as shown by the solid lines in the fifth and sixth traces of FIG. 5. At time t7, address signal ADD may be deasserted to complete the data loading process, as shown in the third trace of FIG. 5.

To load a logic one, data register circuitry 104 may take data signal DL low at time t5, as indicated by the dashed line in the seventh trace of FIG. 5. While data signal DL is low on data line 112, address signal ADD is asserted (at time t6). When transistor TA is turned on by the high ADD signal, data line 112 is electrically connected to node N1. Signal DL on data line 112 is low at time t6, so when TA is turned on at time t6, signal NDATAOUT on node N1 is pulled low, as shown by the dashed line in the fifth trace of FIG. 5. When NDATAOUT goes low, the output of inverter 46 at node N2 goes high, so signal DATAOUT goes high at time t6, as indicated by the dashed line in the sixth trace of FIG. 5. At time t7, address signal ADD is deasserted to complete the data loading process, as shown in the third trace of FIG. 5.

Figure 6:
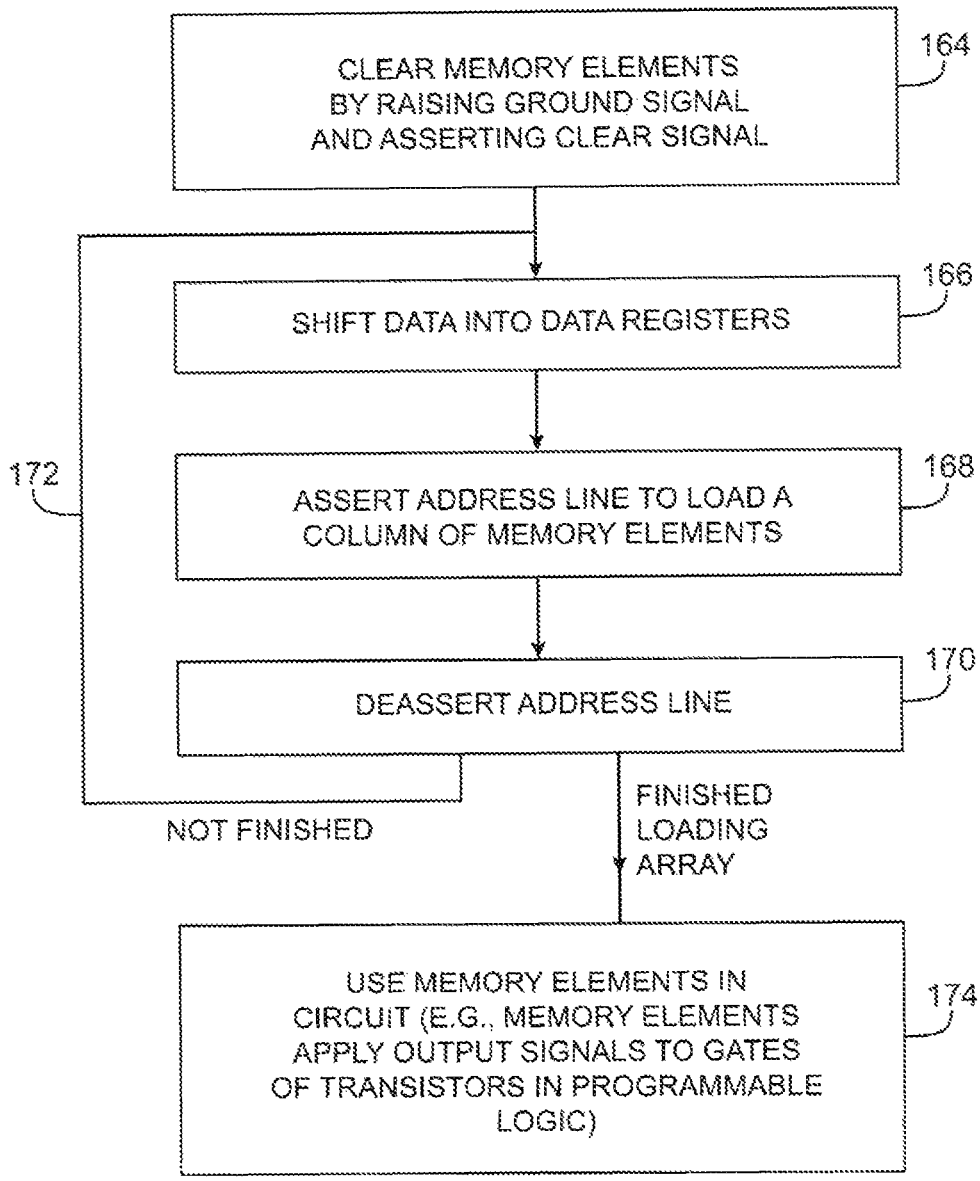
FIG. 6 is a flow chart of illustrative steps involved in operating memory element circuitry on an integrated circuit such as a programmable logic device integrated circuit in accordance with an embodiment of the present invention.

Illustrative steps involved in using memory arrays such as memory array 22 of FIG. 2 are shown in FIG. 6.

At step 164, the memory elements 20 may be cleared. During clear operations, power supply circuitry 120 may momentarily elevate ground power supply signal Vgndcell relative to its normal value (e.g., relative to 0 volts). This weakens transistor TN1 and inverter 52 in each memory element, so that relatively compact clear transistors TC may be used to clear memory elements 20. Clearing is performed by asserting clear signal NCLR (e.g., by taking NCLR low) while Vgndcell is elevated.

At step 166, configuration data is shifted into data register circuitry 104 in control circuitry 100 via path 102 (FIG. 2).

At step 168, control signals are applied to address decoder circuitry 106 of FIG. 2 (e.g., using path 102). The control signals direct address decoder circuitry 106 to assert a desired address line 116 to address a column of memory elements in array 22 (e.g., by taking an appropriate address signal ADD high). Asserting a desired address signal ADD loads the data that is present (in inverted form) on each data line 112 into its associated memory element 20 in the addressed column of array 22.

At step 170, the address line is deasserted (e.g., by taking ADD low). If additional memory elements are to be loaded, processing returns to step 166, as indicated by line 172.

When all of the columns of array 22 have been loaded with data, the loaded memory elements may perform their intended functions (step 174). For example, in a programmable logic device integrated circuit, memory elements 20 may each apply an associated control signal to a pass transistor or other programmable logic component. Each memory element that has been loaded with a logic one provides a logic high DATAOUT output signal and each memory element that has been loaded with a logic zero provides a logic low DATAOUT output signal at its output 118.

The foregoing is merely illustrative of the principles of this invention and various modifications can be made by those skilled in the art without departing from the scope and spirit of the invention.

What is claimed is:

1. A method for using memory elements on an integrated circuit, wherein each memory element has a pair of cross-coupled inverters that store data and at least one clear transistor for clearing the data from the memory element, the method comprising:

powering the cross-coupled inverters using a ground power supply signal equal to a given ground voltage while the cross-coupled inverters store the data during normal operation of the integrated circuit;

during clear operations, elevating the ground power supply signal above the given ground voltage to weaken at least a given one of the cross-coupled inverters in each memory element and asserting a clear control signal to turn on the clear transistor of each memory element, wherein elevating the ground power supply signal above the given ground voltage comprises raising the ground power supply voltage to a positive voltage before asserting the clear control signal;

deasserting the clear control signal to turn off the clear transistor of each memory element; and lowering the elevated ground power supply signal back to the given ground voltage before deasserting the clear control signal.

2. The method defined in claim 1 further comprising:
applying an output signal from each of the memory elements to a corresponding programmable logic transistor as a static control signal.

3. The method defined in claim 1 wherein the integrated circuit comprises a programmable logic device integrated circuit, the method further comprising:
loading programmable logic configuration data into the memory elements.

4. The method defined in claim 3 further comprising:
applying an output signal from each of the memory elements to a corresponding n-channel metal-oxide-semiconductor transistor as a static control signal, wherein the static control signals have states associated with the loaded programmable logic configuration data.

5. The method defined in claim 1, wherein the clear transistor comprises a p-channel metal-oxide-semiconductor clear transistor and wherein asserting the clear control signal to turn on the clear transistor of each memory element comprises:
asserting the clear control signal to turn on the p-channel metal-oxide-semiconductor clear transistor of each memory element.

* * * * *